(12) United States Patent
Lee et al.

(10) Patent No.: US 9,349,784 B2
(45) Date of Patent: May 24, 2016

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-do (KR)

(72) Inventors: Wonkyu Lee, Yongin (KR); Hyunchul Kim, Yongin (KR); Wonmo Park, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 1 day.

(21) Appl. No.: 14/579,924

(22) Filed: Dec. 22, 2014

(65) Prior Publication Data

US 2016/0035813 A1     Feb. 4, 2016

(30) Foreign Application Priority Data

Aug. 4, 2014 (KR) .......................... 10-2014-0099972

(51) Int. Cl.
| | |
|---|---|
| *H01L 29/66* | (2006.01) |
| *H01L 27/32* | (2006.01) |
| *H01L 51/56* | (2006.01) |
| *H01L 51/52* | (2006.01) |

(52) U.S. Cl.
CPC ........ *H01L 27/3276* (2013.01); *H01L 27/3246* (2013.01); *H01L 51/5212* (2013.01); *H01L 51/56* (2013.01); *H01L 2227/323* (2013.01); *H01L 2251/5307* (2013.01)

(58) Field of Classification Search
USPC ............... 257/13, 40, 79–103, 918, 252–254, 257/257–258, 328; 438/30, 48, 128, 149, 438/151, 157, 161, 283
See application file for complete search history.

(56) References Cited

U.S. PATENT DOCUMENTS

| | | | |
|---|---|---|---|
| 2004/0253756 | A1 | 12/2004 | Cok et al. |
| 2010/0102335 | A1 | 4/2010 | Takagi et al. |

(Continued)

FOREIGN PATENT DOCUMENTS

| | | |
|---|---|---|
| CN | 103165644 | 6/2013 |
| JP | 2005-11810 | 1/2005 |

(Continued)

*Primary Examiner* — Dao H Nguyen
*Assistant Examiner* — Tram H Nguyen
(74) *Attorney, Agent, or Firm* — Knobbe Martens Olson & Bear LLP (57) ABSTRACT

An organic light-emitting display apparatus includes: a substrate; a thin film transistor formed on the substrate; a pixel electrode connected to at least one of the source or drain electrodes; a pixel-defining layer having a first opening exposing at least a portion of the pixel electrode and a second opening adjacent to the first opening; an intermediate layer formed on the pixel electrode, including an organic emission layer, and having a first hole corresponding to the second opening; an opposite electrode formed on the intermediate layer; and first and second auxiliary electrodes formed below the pixel-defining layer, at least portions of the first and second auxiliary electrodes are exposed through the second opening, where ends of the first and second auxiliary electrodes are spaced apart from each other, and where the opposite electrode contacts the ends of the and second first auxiliary electrodes which are exposed through the first hole.

20 Claims, 7 Drawing Sheets

(56) References Cited

U.S. PATENT DOCUMENTS

| | | | |
|---|---|---|---|
| 2013/0037817 A1* | 2/2013 | Lee | H01L 27/3265 257/71 |
| 2013/0153939 A1 | 6/2013 | Lee et al. | |
| 2014/0346457 A1* | 11/2014 | Oh | H01L 27/3258 257/40 |
| 2014/0353609 A1* | 12/2014 | Song | H01L 27/3276 257/40 |
| 2014/0361260 A1* | 12/2014 | Kim | H01L 27/3246 257/40 |

FOREIGN PATENT DOCUMENTS

| | | |
|---|---|---|
| JP | 2006-286493 | 10/2006 |
| JP | 2010-108693 | 5/2010 |

* cited by examiner

ORGANIC LIGHT-EMITTING DISPLAY APPARATUS AND METHOD OF MANUFACTURING THE SAME

RELATED APPLICATION

This application claims the benefit of Korean Patent Application No. 10-2014-0099972, filed on Aug. 4, 2014, in the Korean Intellectual Property Office, the disclosure of which is incorporated herein in its entirety by reference.

BACKGROUND

1. Field

One or more embodiments relate to an organic light-emitting display apparatus and a method of manufacturing the same.

2. Description of the Related Technology

Display apparatuses can display various types of images and content and are used in many applications for different purposes. Recently, organic light-emitting display apparatuses have drawn much attention.

An organic light-emitting display apparatus has a self-emitting characteristic and does not need an additional light source, unlike a liquid crystal display apparatus. Thus, the organic light-emitting display apparatus may be manufactured to have a reduced thickness and weight. Also, the organic light-emitting display apparatus has low power consumption, high brightness, and high response rate.

SUMMARY OF CERTAIN INVENTIVE ASPECTS

One or more embodiments include an organic light-emitting display apparatus and a method of manufacturing the same.

Additional aspects will be set forth in part in the description which follows and, in part, will be apparent from the description, or may be learned by practice of the presented embodiments.

According to one or more embodiments, an organic light-emitting display apparatus includes: a substrate; a thin film transistor formed on the substrate and including an active layer, a gate electrode, a source electrode, and a drain electrode; a pixel electrode connected to at least one of the source electrode or the drain electrode; a pixel-defining layer having a first opening exposing at least a portion of the pixel electrode and a second opening adjacent to the first opening; an intermediate layer formed on the pixel electrode, including an organic emission layer, and having a first hole corresponding to the second opening; an opposite electrode formed on the intermediate layer; and a first auxiliary electrode and a second auxiliary electrode formed below the pixel-defining layer, whereby at least portions of the first auxiliary electrode and the second auxiliary electrode are exposed through the second opening, wherein an end of the first auxiliary electrode and an end of the second auxiliary electrode are spaced apart from each other, and wherein the opposite electrode contacts the end of the first auxiliary electrode and the end of the second auxiliary electrode, the end of the first auxiliary electrode and the end of the second auxiliary electrode being exposed through the first hole.

The first auxiliary electrode and the second auxiliary electrode may be formed on the same layer as the pixel electrode.

The first auxiliary electrode and the second auxiliary electrode may include a same material as the pixel electrode.

A size of the second opening may be larger than a size of the first hole.

An end portion of the intermediate layer adjacent to the first hole may cover an etching surface of the second opening.

The first auxiliary electrode and the second auxiliary electrode may include a same material.

A cross-sectional area of the first auxiliary electrode and a cross-sectional area of the second auxiliary electrode may be substantially equal to each other.

Light emitted from the organic emission layer may be released toward the opposite electrode.

The organic light-emitting display apparatus may further include an insulating layer formed below the first auxiliary electrode and the second auxiliary electrode. A portion of the opposite electrode may contact an upper surface of the insulating layer exposed between an end of the first auxiliary electrode and an end of the second auxiliary electrode.

According to one or more embodiments, a method of manufacturing an organic light-emitting display apparatus includes: preparing a substrate on which a thin film transistor is formed, the thin film transistor including an active layer, a gate electrode, and a source electrode and a drain electrode respectively connected to a source region and a drain region of the active layer; forming a pixel electrode connected to at least one of the source electrode or the drain electrode; forming an auxiliary wiring layer including a first auxiliary electrode, a second auxiliary electrode, and a connection wiring interposed between the first auxiliary electrode and the second auxiliary electrode and having a higher resistance than the first and second auxiliary electrodes; forming a pixel-defining layer having a first opening exposing at least a portion of the pixel electrode, and a second opening corresponding to the connection wiring of the auxiliary wiring layer; forming on the pixel-defining layer an intermediate layer including an organic emission layer; forming a first hole in the intermediate layer and removing the connection wiring by supplying currents to the auxiliary wiring layer; and forming an opposite electrode to contact an end of the first auxiliary electrode and an end of the second auxiliary electrode, the end of the first auxiliary electrode and the end of the second auxiliary electrode being exposed through the first hole of the intermediate layer.

A cross-sectional area of the connection wiring may be smaller than a cross-sectional area of the first auxiliary electrode and a cross-sectional area of the second auxiliary electrode.

The cross-sectional area of the first auxiliary electrode and the cross-sectional area of the second auxiliary electrode may be substantially equal to each other.

Forming of the auxiliary wiring layer may include reducing a thickness of the connection wiring to be smaller than a thickness of the first auxiliary electrode and a thickness of the second auxiliary electrode by using a half-tone mask having a half-transmittance region at a location corresponding to the connection wiring.

A width of the connection wiring may be smaller than a width of the first auxiliary electrode and a width of the second auxiliary electrode.

The connection wiring may include a material having a higher resistance than the first auxiliary electrode and the second auxiliary electrode.

Forming of the auxiliary wiring layer and forming of the pixel electrode may be simultaneously performed in same process.

The first opening may expose at least a portion of the pixel electrode, and the second opening may expose the connection wiring, an end of the first auxiliary electrode adjacent to the connection wiring, and an end of the second auxiliary electrode adjacent to the connection wiring.

A size of the first hole may be smaller than a size of the second opening.

An end portion of the intermediate layer adjacent to the first hole may cover an etching surface of the second opening.

The end of the first auxiliary electrode and the end of the second auxiliary electrode may be spaced apart from each other, and an upper surface of an insulating layer placed below the first and second auxiliary electrodes may be exposed between the ends of the first auxiliary electrode and the second auxiliary electrode.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF CERTAIN INVENTIVE EMBODIMENTS

Reference will now be made in detail to embodiments, examples of which are illustrated in the accompanying drawings, wherein like reference numerals generally refer to like elements throughout. In this regard, the presented embodiments may have different forms and should not be construed as being limited to the descriptions set forth herein. Accordingly, the embodiments are merely described below, by referring to the figures, to explain aspects of the present description.

It will be understood that although the terms "first," "second," and the like may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Figure 1:
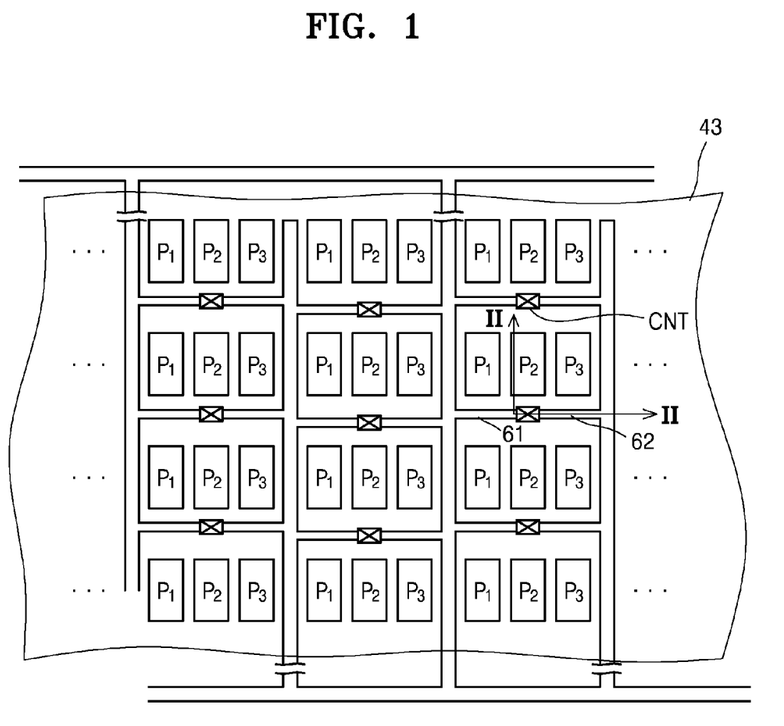
FIG. 1 is a plan view of pixels and auxiliary electrodes of an organic light-emitting display apparatus according to an embodiment.
Figure 2:
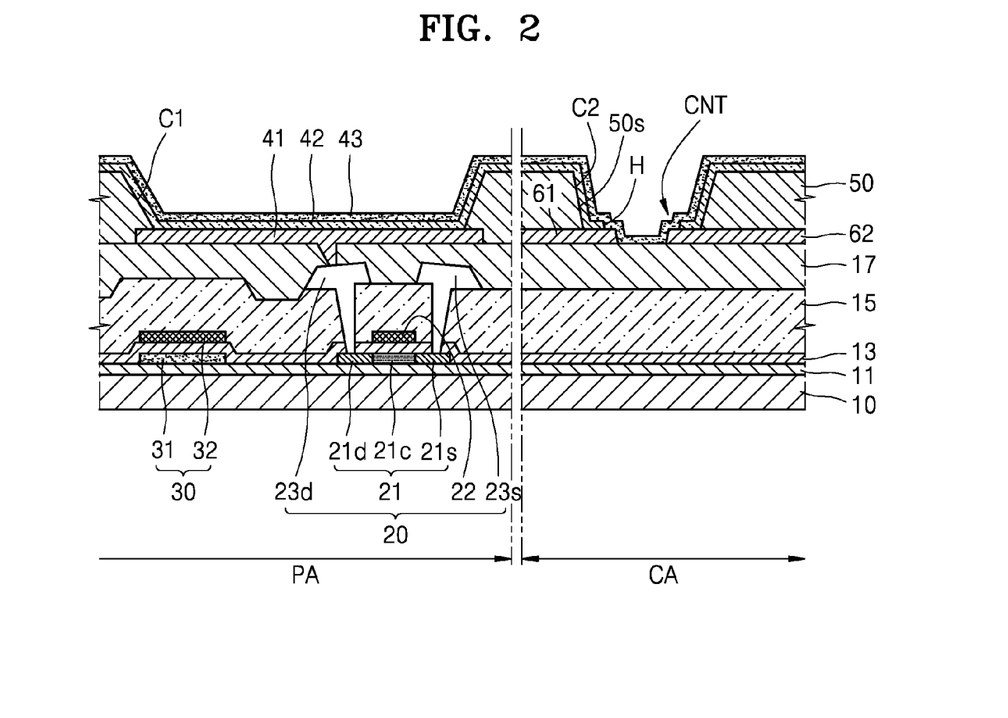
FIG. 2 is a cross-sectional view of an organic light-emitting display apparatus, taken along line II-II of FIG. 1.
Figure 3:
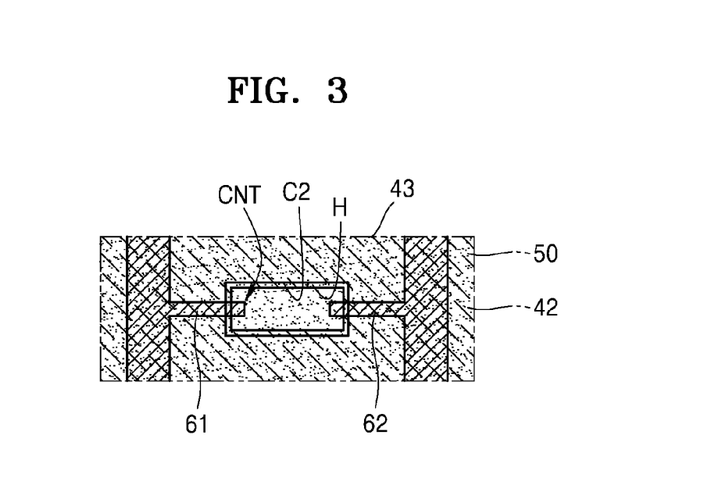
FIG. 3 is a plan view of a contact area CA of FIG. 2.

FIG. 1 is a plan view of pixels and auxiliary electrodes of an organic light-emitting display apparatus according to an embodiment. FIG. 2 is a cross-sectional view of the organic light-emitting display apparatus, taken along line II-II of FIG. 1. FIG. 3 is a plan view of a contact area CA of FIG. 2.

Referring to FIGS. 1 and 2, the organic light-emitting display apparatus may include a plurality of pixels P1, P2, and P3, a first auxiliary electrode 61 and a second auxiliary electrode 62 extended between the plurality of pixels P1, P2, and P3, and a contact portion CNT contacting an opposite electrode 43 and the first and second auxiliary electrodes 61 and 62. The opposite electrode 43 may be formed throughout a display region of the organic light-emitting display apparatus. The display region refers to a region in which an image is displayed. The display region may refer to all regions of the organic light-emitting display apparatus, except boundary regions of the organic light-emitting display apparatus, in which a controller, or the like, are placed.

According to a direction in which an image is realized, the organic light-emitting display apparatus may be divided into a top emission type, in which the image is realized toward an opposite direction of the substrate 10, that is, from the substrate 10 toward the opposite electrode 43, and a bottom emission type in which the image is realized toward the substrate 10. The top emission type has a higher aperture ratio than the bottom emission type. However, in order to realize the image in the top emission type, the opposite electrode 43 must be formed by using a transparent electrode, such as, for example, ITO, and such a transparent electrode usually has high resistance so that IR drop may occur. According to another embodiment, the opposite electrode 43 may be formed by using a metal having low resistance, such as, for example, Ag and Mg. In order to raise a transmittance rate, the opposite electrode 43 must be formed very thin. Thus, the IR drop may also occur. The IR drop becomes a more serious problem as a size of the opposite electrode 43 is increased according to an enlargement of organic light-emitting display apparatuses.

In order to realize a top emission type having a large size with decreased resistance of the opposite electrode 43, the organic light-emitting display apparatus includes the first auxiliary electrode 61 and the second auxiliary electrode 62 formed such that an end of the first auxiliary electrode 61 and an end of the second auxiliary electrode 62 are spaced apart from each other, and the contact portion CNT in which the opposite electrode 43 contacts an end of the first auxiliary electrode 61 and an end of the second auxiliary electrode 62.

Referring to FIG. 2, the organic light-emitting display apparatus includes a pixel area PA in which light is emitted, and the contact area CA interposed between neighboring pixels.

The substrate 10 may include various materials including, for example, glass materials, metal materials, or plastic materials such as polyethylen terephthalate (PET), polyethylen naphthalate (PEN), and polyimide.

A buffer layer 11 may be formed on the substrate 10. The buffer layer 11 planarizes the substrate 10 and prevents penetration of impure elements.

An active layer 21 may be formed of a semiconductor including amorphous silicon or crystalline silicon, for example. The active layer 21 includes a channel region 21c, and a source region 21s and a drain region 21d which are arranged at both sides of the channel region 21c, with the channel region 21c as the center. The source region 21s and the drain region 21d are doped with ion impurities. The active layer 21 is not limited to amorphous silicon or crystalline silicon and may include an oxide semiconductor, for example.

A gate electrode 22 is formed on the active layer 21 at a location corresponding to the channel region 21c of the active layer 21 with a first insulating layer 13, which is a gate insulating layer, between the active layer 21 and the gate electrode 22

A source electrode 23s and a drain electrode 23d are formed on the gate electrode 22 with a second insulating layer 15, which is an interlayer insulating layer, between the gate electrode 22 and the source and the drain electrodes 23s and 23d. The source electrode 23s and the drain electrode 23d respectively contact the source region 21s and the drain region 21d of the active layer 21. A third insulating layer 17, which is a planarization layer, is formed on the second insulating layer 15 to cover the source electrode 23s and the drain electrode 23d.

A capacitor 30 may include a lower electrode 31 and an upper electrode 32. Although FIG. 1 illustrates a case in which the lower electrode 31 of the capacitor 30 is formed on the same layer as the active layer 21, and the upper electrode 32 of the capacitor 30 is formed on the same layer as the gate electrode 22, embodiments are not limited thereto.

A pixel electrode 41 is formed on the third insulating layer 17 and contacts the drain electrode 23d. The pixel electrode 41 is a reflective electrode and may include a reflective layer formed of, for example, Ag, Mg, Al, Pt, Pd, Au, Ni, Nd, Ir, Cr, or a compound thereof, and a layer which is formed on the reflective layer by using, for example, ITO, IZO, ZnO, or $In_2O_3$.

Since the first auxiliary electrode 61 and the second auxiliary electrode 62 are formed in the same process, the first auxiliary electrode 61 and the second auxiliary electrode 62 may be formed on the same layer by using the same material. The first and second auxiliary electrodes 61 and 62 may be formed on the same layer as the pixel electrode 41. The first and second auxiliary electrodes 61 and 62 may be formed of the same material as the pixel electrode 41.

As illustrated in FIG. 3, an end of the first auxiliary electrode 61 and an end of the second auxiliary electrode 62 are arranged apart from each other. To reduce a resistance gap of the first auxiliary electrode 61 and the second auxiliary electrode 62, the first auxiliary electrode 61 and the second auxiliary electrode 62 may be formed to have substantially the same cross-sectional area.

A pixel-defining layer 50 includes a first opening C1 defining the pixel area PA and a second opening C2 formed in the contact area CA. An upper surface of the pixel electrode 41 is exposed through the first opening C1, and an end of the first auxiliary electrode 61 and an end of the second auxiliary electrode 62 may be exposed through the second opening C2.

An intermediate layer 42 is formed on the pixel electrode 41 exposed through the first opening C1 and on the pixel-defining layer 50. The intermediate layer 42 includes an organic emission layer, and the organic emission layer may be a low molecular weight organic material or a high molecular weight organic material. When the organic emission layer is the low molecular weight material, a hole transparent layer HTL, a hole injection layer HIL, an electron transport layer ETL, and an electron injection layer EIL may be stacked around the organic emission layer. When the organic emission layer is the high molecular weight material, the intermediate layer 42 may further include the hole transport layer HTL.

The intermediate layer 42 includes a first hole H formed at a location corresponding to the second opening C2. The first hole H is an opening for contacting ends of the first and second auxiliary electrodes 61 and 62 and the opposite electrode 43. The end of the first auxiliary electrode 61 and the end of the second auxiliary electrode 62 may be exposed through the first hole H. Since the end of the first auxiliary electrode 61 and the end of the second auxiliary electrode 62 are arranged apart from each other, an upper surface of the third insulating layer 17 may be exposed through the first hole H between the ends of the first auxiliary electrode 61 and the second auxiliary electrode 62.

The first hole H and the second opening C2 are formed by different processes, and thus, the first hole H and the second opening C2 may have different sizes as illustrated in FIGS. 2 and 3. For example, the size of the first hole H may be smaller than the size of the second opening C2.

The first hole H is formed by heat generated as currents are supplied to the first and second auxiliary electrodes 61 and 62, and thus, a part of the intermediate layer 42 on an etching surface 50s of the pixel-defining layer 50 may remain intact. An end of the intermediate layer 42, which is adjacent to the first hole H, may cover the etching surface 50s of the pixel-defining layer 50. The forming of the first hole H is described by referring to FIGS. 7A and 7B below.

The opposite electrode 43 is formed on the intermediate layer 42 and has light transmittance. The opposite electrode 43 may include a transparent material, such as, for example, ITO, IZO, ZnO, or $In_2O_3$. The opposite electrode 43 contacts an end of the first auxiliary electrode 61 and an end of the second auxiliary electrode 62 through the first hole H. The opposite electrode 43 may also contact the upper surface of the third insulating layer 17, which is exposed through the first hole H between the ends of the first auxiliary electrode 61 and the second auxiliary electrode 62. The opposite electrode 43 may contact the first and second auxiliary electrodes 61 and 62 having a higher electrical conductivity than the opposite electrode 43, thereby preventing the IR drop, as described earlier.

Hereinafter, a method of manufacturing an organic light-emitting display apparatus, according to an embodiment, will be described by referring to FIGS. 4A through 8B.

FIGS. 4A through 8B illustrate processes of the method of manufacturing the organic light-emitting display apparatus.

Figure 4A:
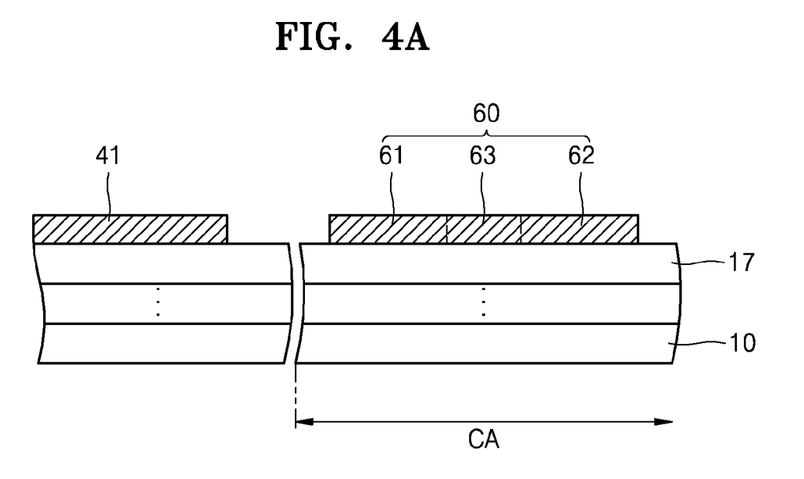
FIG. 4A is a cross-sectional view for describing a process of forming an auxiliary wiring layer and a process of forming a pixel electrode.
Figure 4B:
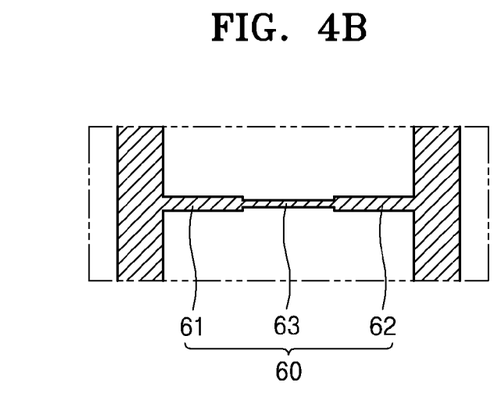
FIG. 4B is a plan view of a contact area CA of FIG. 4A.

FIG. 4A is a cross sectional view for describing a process of forming an auxiliary wiring layer 60 and the pixel electrode 41. FIG. 4B is a plan view of a contact area CA of FIG. 4A.

The substrate 10 on which a thin film transistor including an active layer, a gate electrode, and a source electrode and a drain electrode respectively connected to a source region and a drain region of the active layer, is formed, is prepared, and the auxiliary wiring layer 60 is formed on the substrate 10.

The auxiliary wiring layer 60 may be formed by the process in which the pixel electrode 41 is formed, by using the same mask. The auxiliary wiring layer 60 may be formed on the same layer as the pixel electrode 41 to be spaced apart from the pixel electrode 41 to be electrically insulated from the pixel electrode 41. The auxiliary wiring layer 60 and the pixel electrode 41 may include the same material. The auxiliary wiring layer 60 and the pixel electrode 41 may include a metal layer including, for example, Ag, Mg, Al, Pt, Pd, Au, Ni, Nd, Ir, Cr, or a compound thereof, and a layer formed on the metal layer by using, for example, ITO, IZO, ZnO, or $In_2O_3$.

The auxiliary wiring layer 60 includes the first auxiliary electrode 61, the second auxiliary electrode 62, and a connection wiring 63 interposed between the first and second auxiliary electrodes 61 and 62. The connection wiring 63 has a higher resistance than the first auxiliary electrode 61 and the second auxiliary electrode 62. For example, the connection wiring 63 may have a smaller cross-sectional area than the first auxiliary electrode 61 and the second auxiliary electrode 62, and thus, the connection wiring 63 may have a relatively higher resistance. Since the connection wiring 63 has the relatively higher resistance, Joule's heat generated in the connection wiring 63 due to currents flowing through the auxiliary wiring layer 60 in a process described below, may have a high value. In order for the Joule's heat of the relatively high value not to be generated in regions of the auxiliary wiring layer 60, except the connection wiring 63, the first and second auxiliary electrodes 61 and 62 may have larger cross-sectional areas than the connection wiring 63, and the first auxiliary electrode 61 and the second auxiliary electrode 62 may have substantially the same area.

As illustrated in FIG. 4B, the connection wiring 63 may have a smaller width than the first auxiliary electrode 61 and the second auxiliary electrode 62. In another embodiment, the connection wiring 63 may have a smaller thickness than the first auxiliary electrode 61 and the second auxiliary electrode 62. In this case, the connection wiring 63 may be formed to have the thickness smaller than those of the first and second auxiliary electrodes 61 and 62, by using a half-tone mask having a half-transmittance region at a location corresponding to the connection wiring 63. In another embodiment, the connection wiring 63 may include a material having a higher resistance than materials of the first and second auxiliary electrodes 61 and 62.

Figure 5A:
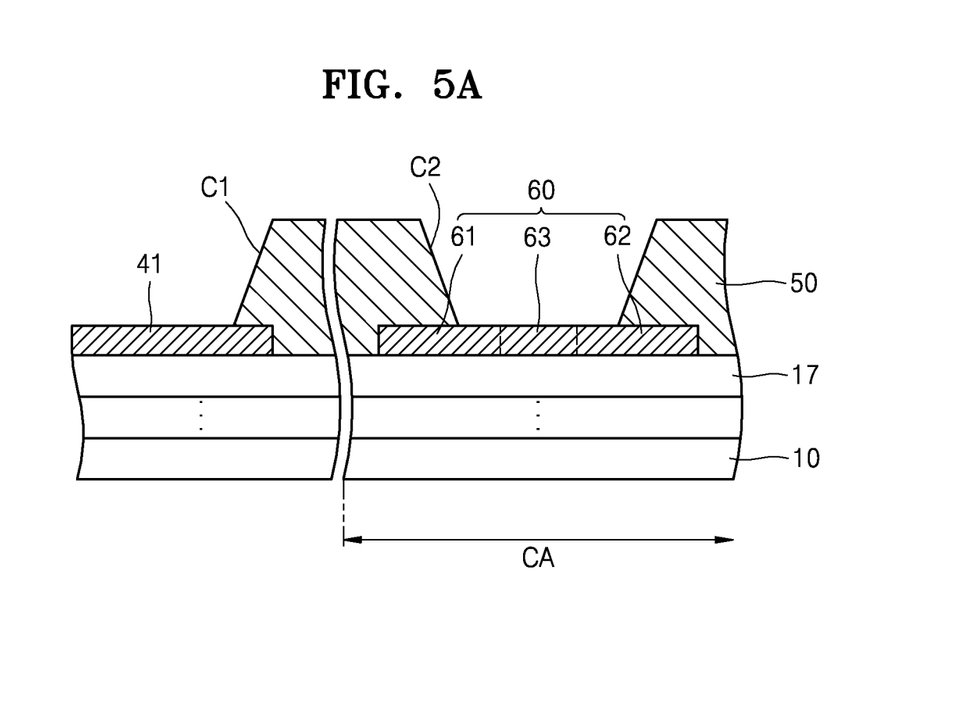
FIG. 5A is a cross-sectional view for describing a process of forming a pixel-defining layer.
Figure 5B:
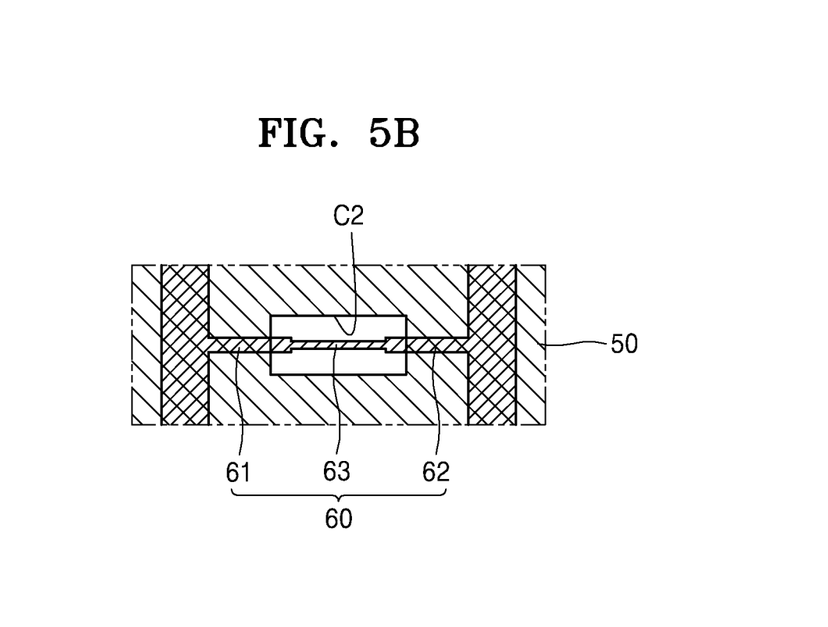
FIG. 5B is a plan view of a contact area CA of FIG. 5A.

FIG. 5A is a cross-sectional view for describing a process of forming the pixel-defining layer 50 and FIG. 5B is a plan view of a contact area CA of FIG. 5A.

The pixel-defining layer 50 is formed on the pixel electrode 41 and the auxiliary wiring layer 60. The pixel-defining layer 50 includes the first opening C1 and the second opening C2. The first opening C1 may expose an upper surface of the pixel electrode 41 and define a pixel area. The second opening C2 may expose an upper surface of the auxiliary wiring layer 60 in the contact area CA. A part of the first auxiliary electrode 61, a part of the second auxiliary electrode 62, and the connection wiring 63 of the auxiliary wiring layer 60 may be exposed through the second opening C2.

Figure 6A:
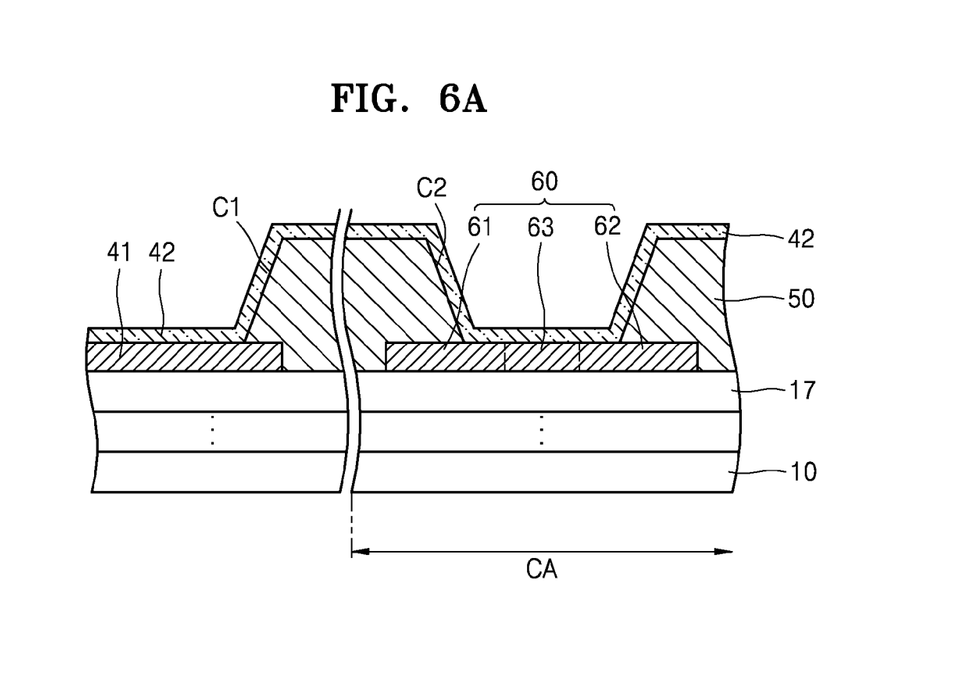
FIG. 6A is a cross-sectional view for describing a process of forming an intermediate layer.
Figure 6B:
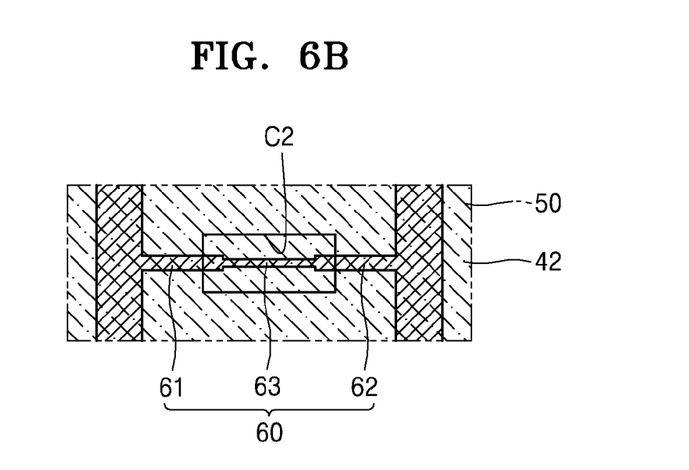
FIG. 6B is a plan view of a contact area CA of FIG. 6A.

FIG. 6A is a cross-sectional view for describing a process of forming the intermediate layer 42 and FIG. 6B is a plan view of a contact area CA of FIG. 6A.

The intermediate layer 42 is formed on the pixel-defining layer 50 having the first and second openings C1 and C2. The intermediate layer 42 may be placed on the pixel electrode 41 exposed through the first opening C1 in the pixel area and on the auxiliary wiring layer 60 exposed through the second opening C2 in the contact area CA.

The intermediate layer 42 includes an organic emission layer. The organic emission layer may include a low molecular weight organic material or a high molecular weight organic material. When the organic emission layer includes the low molecular weight organic material, a hole transport layer HTL, a hole injection layer HIL, an electron transport layer ETL, and an electron injection layer EIL may be stacked around the organic emission layer. When the organic emission layer includes the high molecular weight organic material, the intermediate layer 42 may further include the hole transport layer HTL.

Figure 7A:
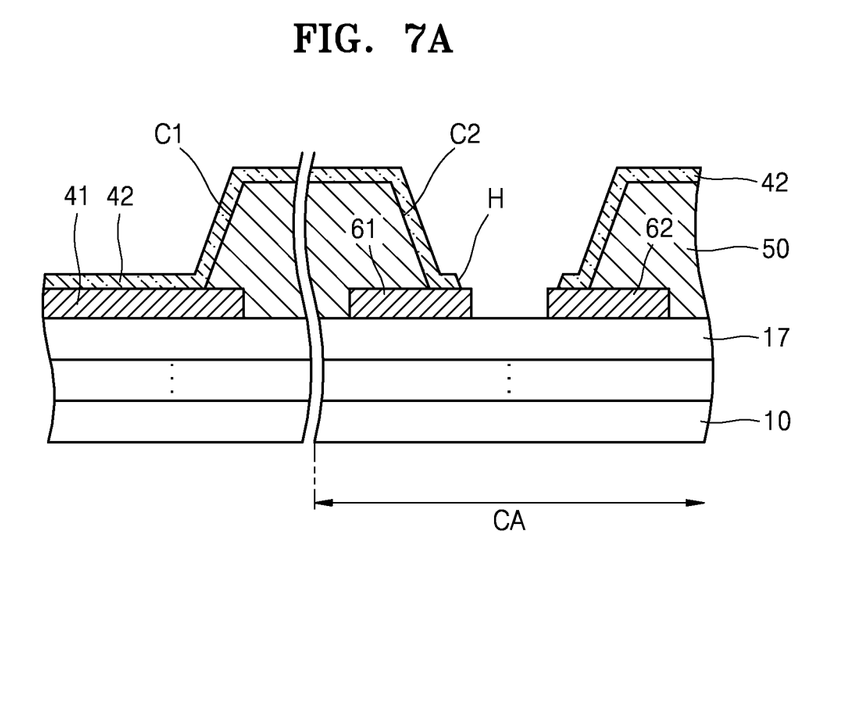
FIG. 7A is a cross-sectional view for describing a process of forming a first hole and removing a connection wiring.
Figure 7B:
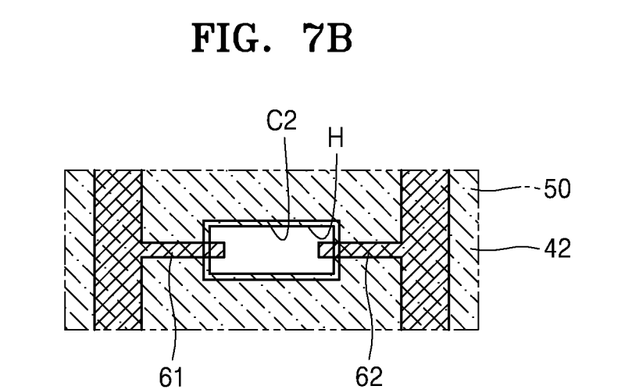
FIG. 7B is a plan view of a contact area CA of FIG. 7A.

FIG. 7A is a cross-sectional view for describing a process of forming the first hole H and removing the connection wiring 63. FIG. 7B is a plan view of a contact area CA of FIG. 7A.

When currents are supplied to the first auxiliary electrode 61 and the second auxiliary electrode 62, Joule's heat generated in the connection wiring 63 is higher since resistance of the connection wiring 63 is higher than that of the first and second auxiliary electrodes 61 and 62. The intermediate layer 42 around the connection wiring 63 may be selectively removed by the Joule's heat generated in the connection wiring 63 such that the first hole H is formed. The first hole H is formed by the Joule's heat in the connection wiring 63, and thus, a location of the first hole H corresponds to a location of the connection wiring 63. A size of the first hole H may be larger than a size of the connection wiring 63 (for example, an area of the connection wiring 63) and smaller than a size of the second opening C2 of the pixel-defining layer 50.

The intermediate layer 42 on the etching surface 50s of the second opening C2 is not affected by the Joule's heat generated in the connection wiring 63. Thus, an end of the intermediate layer 42, which is adjacent to the first hole H, is placed on the etching surface 50s of the second opening C2.

The connection wiring 63 may be removed by the Joule's heat generated in the connection wiring 63. That the connection wiring 63 is removed denotes that the shape of the connection wiring 63 is destroyed so that the first auxiliary electrode 61 and the second auxiliary electrode 62 at both sides of the connection wiring 63 are spaced apart from each other without being electrically connected to each other.

The connection wiring 63 may be melted and broken by the Joule's heat generated in the connection wiring 63. A portion of a material generated by the melting of the connection wiring 63 may form an end of the first auxiliary electrode 61 and the other portion of the material may form an end of the second auxiliary electrode 62. If the Joule's heat of a very high value is generated in the connection wiring 63, the connection wiring 63 is broken and vaporized to be removed along with the intermediate layer 42.

As the connection wiring 63 is removed, an end of the first auxiliary electrode 61 and an end of the second auxiliary electrode 62 is spaced apart from each other, and an upper surface of the third insulating layer 17 may be exposed between the ends of the first and second auxiliary electrodes 61 and 62.

Figure 8A:
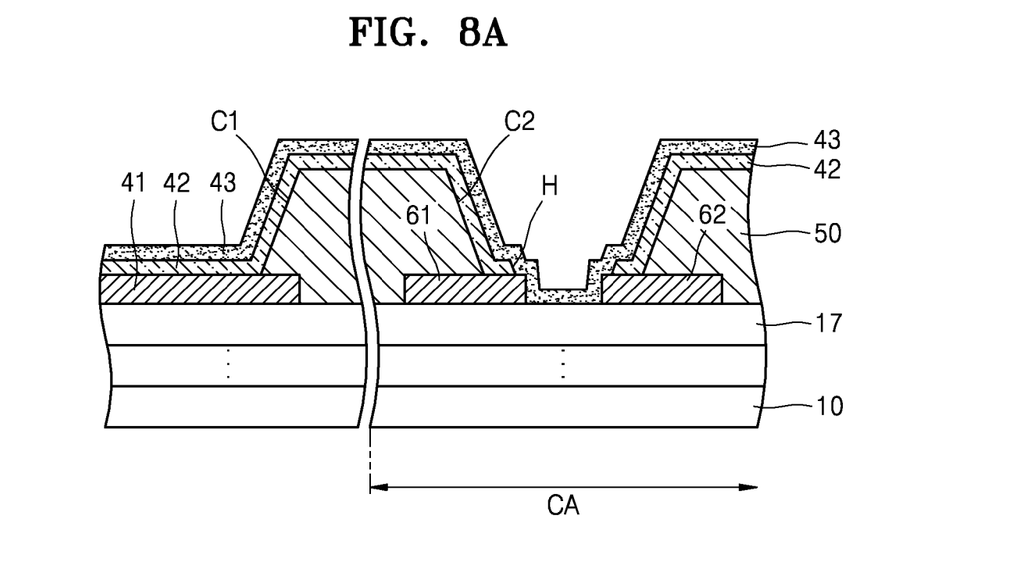
FIG. 8A is a cross-sectional view for describing a process of forming an opposite electrode.
Figure 8B:
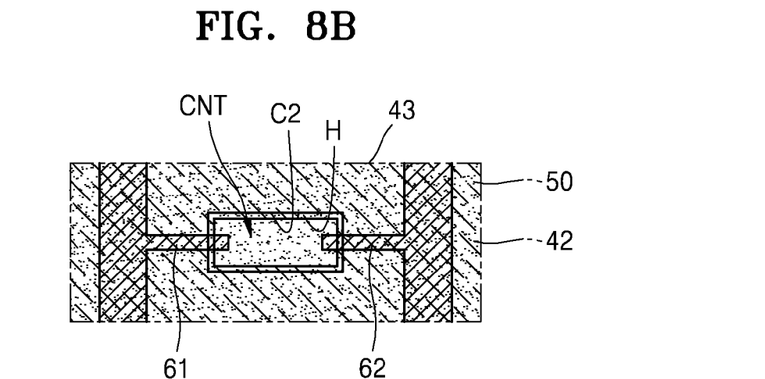
FIG. 8B is a plan view of a contact area CA of FIG. 8A.

FIG. 8A is a cross-sectional view for describing a process of forming the opposite electrode 43 and FIG. 8B is a plan view of a contact area CA of FIG. 8A.

The opposite electrode 43 may include a transparent material, such as, for example, ITO, IZO, ZnO, or $In_2O_3$. The opposite electrode 43 contacts the end of the first auxiliary electrode 61 and the end of the second auxiliary electrode 62, which are exposed through the first hole H. Since the upper surface of the third insulating layer 17 may be exposed between the ends of the first and second auxiliary electrodes 61 and 62, a portion of the opposite electrode 43 may also contact the upper surface of the third insulating layer 17.

Since the contact portion CNT contacting the opposite electrode 43 and the first and second auxiliary electrodes 61 and 62 is formed, the resistance of the opposite electrode 43 of the top emission type organic light-emitting display apparatus having a large size, may be reduced. Accordingly, gaps in terms of brightness of the organic light-emitting display apparatus due to the IR drop and a stain may be minimized.

As described above, according to the one or more of the above embodiments, an organic light-emitting display apparatus which is easily manufactured and has high emission stability may be manufactured.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made herein without departing from the spirit and scope of the present invention as defined by the following claims.

What is claimed is:

1. An organic light-emitting display apparatus comprising:
   a substrate;
   a thin film transistor formed on the substrate and comprising an active layer, a gate electrode, a source electrode, and a drain electrode;
   a pixel electrode connected to at least one of the source electrode or the drain electrode;
   a pixel-defining layer having a first opening exposing at least a portion of the pixel electrode, and a second opening adjacent to the first opening;
   an intermediate layer formed on the pixel electrode, comprising an organic emission layer, and having a first hole corresponding to the second opening;
   an opposite electrode formed on the intermediate layer; and
   a first auxiliary electrode and a second auxiliary electrode formed below the pixel-defining layer, whereby at least portions of the first auxiliary electrode and the second auxiliary electrode are exposed through the second opening,
   wherein an end of the first auxiliary electrode and an end of the second auxiliary electrode are spaced apart from each other, and
   wherein the opposite electrode contacts the end of the first auxiliary electrode and the end of the second auxiliary electrode, the end of the first auxiliary electrode and the end of the second auxiliary electrode being exposed through the first hole.

2. The organic light-emitting display apparatus of claim 1, wherein the first auxiliary electrode and the second auxiliary electrode are formed on the same layer as the pixel electrode.

3. The organic light-emitting display apparatus of claim 1, wherein the first auxiliary electrode and the second auxiliary electrode comprise a same material as the pixel electrode.

4. The organic light-emitting display apparatus of claim 1, wherein a size of the second opening is larger than a size of the first hole.

5. The organic light-emitting display apparatus of claim 1, wherein an end portion of the intermediate layer adjacent to the first hole covers an etching surface of the second opening.

6. The organic light-emitting display apparatus of claim 1, wherein the first auxiliary electrode and the second auxiliary electrode comprise a same material.

7. The organic light-emitting display apparatus of claim 1, wherein a cross-sectional area of the first auxiliary electrode and a cross-sectional area of the second auxiliary electrode are substantially equal to each other.

8. The organic light-emitting display apparatus of claim 1, wherein light emitted from the organic emission layer is released toward the opposite electrode.

9. The organic light-emitting display apparatus of claim 1, further comprising an insulating layer formed below the first auxiliary electrode and the second auxiliary electrode,
   and wherein a portion of the opposite electrode contacts an upper surface of the insulating layer exposed between an end of the first auxiliary electrode and an end of the second auxiliary electrode.

10. A method of manufacturing an organic light-emitting display apparatus, the method comprising:
    preparing a substrate on which a thin film transistor is formed, the thin film transistor comprising an active layer, a gate electrode, and a source electrode and a drain electrode respectively connected to a source region and a drain region of the active layer;
    forming a pixel electrode connected to at least one of the source electrode or the drain electrode;
    forming an auxiliary wiring layer comprising a first auxiliary electrode, a second auxiliary electrode, and a connection wiring interposed between the first auxiliary electrode and the second auxiliary electrode and having a higher resistance than the first and second auxiliary electrodes;
    forming a pixel-defining layer having a first opening exposing at least a portion of the pixel electrode, and a second opening corresponding to the connection wiring of the auxiliary wiring layer;
    forming on the pixel-defining layer an intermediate layer comprising an organic emission layer;
    forming a first hole in the intermediate layer and removing the connection wiring by supplying currents to the auxiliary wiring layer; and
    forming an opposite electrode to contact an end of the first auxiliary electrode and an end of the second auxiliary electrode, the end of the first auxiliary electrode and the end of the second auxiliary electrode being exposed through the first hole of the intermediate layer.

11. The method of claim 10, wherein a cross-sectional area of the connection wiring is smaller than a cross-sectional area of the first auxiliary electrode and a cross-sectional area of the second auxiliary electrode.

12. The method of claim 11, wherein the cross-sectional area of the first auxiliary electrode and the cross-sectional area of the second auxiliary electrode are substantially equal to each other.

13. The method of claim 10, wherein forming of the auxiliary wiring layer comprises reducing a thickness of the connection wiring to be smaller than a thickness of the first auxiliary electrode and a thickness of the second auxiliary electrode by using a half-tone mask having a half-transmittance region at a location corresponding to the connection wiring.

14. The method of claim 10, wherein a width of the connection wiring is smaller than a width of the first auxiliary electrode and a width of the second auxiliary electrode.

15. The method of claim 10, wherein the connection wiring comprises a material having a higher resistance than the first auxiliary electrode and the second auxiliary electrode.

16. The method of claim 10, wherein forming of the auxiliary wiring layer and forming of the pixel electrode are simultaneously performed.

17. The method of claim 10, wherein the first opening exposes at least a portion of the pixel electrode, and the second opening exposes the connection wiring, an end of the first auxiliary electrode adjacent to the connection wiring, and an end of the second auxiliary electrode adjacent to the connection wiring.

18. The method of claim 10, wherein a size of the first hole is smaller than a size of the second opening.

19. The method of claim 10, wherein an end portion of the intermediate layer adjacent to the first hole covers an etching surface of the second opening.

20. The method of claim 10, wherein the end of the first auxiliary electrode and the end of the second auxiliary electrode are spaced apart from each other, and an upper surface of an insulating layer placed below the first and second auxiliary electrodes is exposed between the ends of the first auxiliary electrode and the second auxiliary electrode.

* * * * *